United States Patent
Marquart (10) Patent No.: US 8,320,185 B2
(45) Date of Patent: Nov. 27, 2012

(54) LIFETIME MARKERS FOR MEMORY DEVICES

(75) Inventor: Todd Marquart, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 316 days.

(21) Appl. No.: 12/751,630

(22) Filed: Mar. 31, 2010

(65) Prior Publication Data

US 2011/0242901 A1  Oct. 6, 2011

(51) Int. Cl.
*G11C 11/34* (2006.01)

(52) U.S. Cl. .................................... 365/185.19
(58) Field of Classification Search ............. 365/185.19
See application file for complete search history.

(56) References Cited

U.S. PATENT DOCUMENTS

| | | | |
|---|---|---|---|
| 6,249,838 B1 * | 6/2001 | Kon | 711/103 |
| 7,142,455 B1 * | 11/2006 | Lee et al. | 365/185.19 |
| 7,292,476 B2 | 11/2007 | Goda et al. | |
| 7,356,442 B1 * | 4/2008 | Astigarraga et al. | 702/182 |
| 7,408,810 B2 | 8/2008 | Aritome et al. | |
| 7,499,330 B2 | 3/2009 | Goda et al. | |
| 7,593,259 B2 | 9/2009 | Kim | |
| 7,619,931 B2 | 11/2009 | Mihnea et al. | |
| 7,770,079 B2 * | 8/2010 | Radke et al. | 714/718 |
| 2004/0218440 A1 * | 11/2004 | Kumar et al. | 365/202 |
| 2005/0041453 A1 * | 2/2005 | Brazis et al. | 365/63 |
| 2005/0044454 A1 * | 2/2005 | Moshayedi | 714/54 |
| 2007/0047314 A1 | 3/2007 | Goda et al. | |
| 2007/0195603 A1 | 8/2007 | Aritome et al. | |
| 2008/0008006 A1 | 1/2008 | Goda et al. | |
| 2008/0062760 A1 | 3/2008 | Kim | |
| 2008/0291730 A1 | 11/2008 | Aritome et al. | |
| 2009/0003078 A1 | 1/2009 | Mihnea et al. | |
| 2009/0103371 A1 | 4/2009 | Goda et al. | |
| 2009/0225595 A1 | 9/2009 | Kim | |
| 2009/0316489 A1 | 12/2009 | Han | |

* cited by examiner

*Primary Examiner* — Hoai V Ho
*Assistant Examiner* — Pablo Huerta
(74) *Attorney, Agent, or Firm* — Brooks, Cameron & Huebsch, PLLC (57) ABSTRACT

The present disclosure includes lifetime markers for memory devices. One or more embodiments include determining a read disturb value, a quantity of erase pulses, and/or a quantity of soft program pulses associated with a number of memory cells, and providing an indicator of an advance and/or retreat of the read disturb value, the quantity of erase pulses, and/or the quantity of soft program pulses relative to a lifetime marker associated with the memory cells.

36 Claims, 4 Drawing Sheets

LIFETIME MARKERS FOR MEMORY DEVICES

TECHNICAL FIELD

The present disclosure relates generally to semiconductor memory devices, methods, and systems, and more particularly, to lifetime markers for memory devices.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), phase change random access-memory (PCRAM), and flash memory, among others.

Flash memory devices can be utilized as volatile and non-volatile memory for a wide range of electronic applications. Flash memory devices typically use a one-transistor memory cell that allows for high memory densities, high reliability, and low power consumption. Uses for flash memory include memory for solid state drives (SSDs), personal computers, personal digital assistants (PDAs), digital cameras, cellular telephones, portable music players, e.g., MP3 players, and movie players, among other electronic devices. Data, such as program code, user data, and/or system data, such as a basic input/output system (BIOS), are typically stored in flash memory devices.

Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to (and in some cases form) an access line, which is commonly referred to in the art as a "word line". However each memory cell is not directly coupled to a data line (which is commonly referred to as a digit line, e.g., a bit line, in the art) by its drain. Instead, the memory cells of the array are coupled together in series, source to drain, between a common source and a data line, where the memory cells commonly coupled to a particular data line are referred to as a "column".

Memory cells in a NAND array architecture can be programmed to a desired state. For example, electric charge can be placed on or removed from a charge storage node of a memory cell to put the cell into one of a number of programmed states. For example, a single level cell (SLC) can represent two states, e.g., 1 or 0. Flash memory cells can also store more than two states, e.g., 1111, 0111, 0011, 1011, 1001, 0001, 0101, 1101, 1100, 0100, 0000, 1000, 1010, 0010, 0110, and 1110. Such cells can be referred to as multilevel cells (MLCs). MLCs can allow the manufacture of higher density memories without increasing the number of memory cells since each cell can represent more than one digit, e.g., more than one bit. For example, a cell capable of representing four digits can have sixteen programmed states.

As flash memory cells in a flash memory device undergo programming, sensing, and erase cycles over the lifetime of the device, the accuracy and/or reliability of the cells may decrease, and a failure of the device may eventually occur. For example, after a particular point in the lifetime of the device, programming and/or sensing operations performed on the cells may not be accurate and/or reliable, resulting in a failure of the device.

A number of approaches can be used to monitor and/or anticipate the remaining lifetime of the device, e.g., the anticipated point at which the device may fail. For example, the number and/or duration of programming, sensing, and/or erase operations performed on the cells in the device can be tracked, e.g., counted, and an anticipated failure of the device can be indicated when the number and/or duration of programming, sensing, and/or erase operations performed on the cells reaches a particular quantity. These approaches, however, may not provide an accurate or reliable indication of the actual remaining lifetime of the device, because they may not account for variations in the storage and/or operating environment, e.g., temperature, of the device that can alter the remaining lifetime of the device.

DETAILED DESCRIPTION

The present disclosure includes lifetime markers for memory devices. One or more embodiments include determining a read disturb value, a quantity of erase pulses, and/or a quantity of soft program pulses associated with a number of memory cells, and providing an indicator of an advance and/or retreat of the read disturb value, the quantity of erase pulses, and/or the quantity of soft program pulses relative to a lifetime marker associated with the memory cells.

Embodiments of the present disclosure can be used to accurately and/or reliably monitor and/or anticipate the remaining lifetime of a memory device, e.g., the anticipated point at which the device may fail. For example, embodiments of the present disclosure can account for variations in the storage and/or operating environment, e.g., temperature, of the device that can alter the remaining lifetime of the device. Further, embodiments of the present disclosure can be used to monitor and/or anticipate the remaining lifetime of a memory device having multilevel cells.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory devices can refer to one or more memory devices. Additionally, the designators "N", "M", "B", "R", and "S" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 200 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

Figure 1:
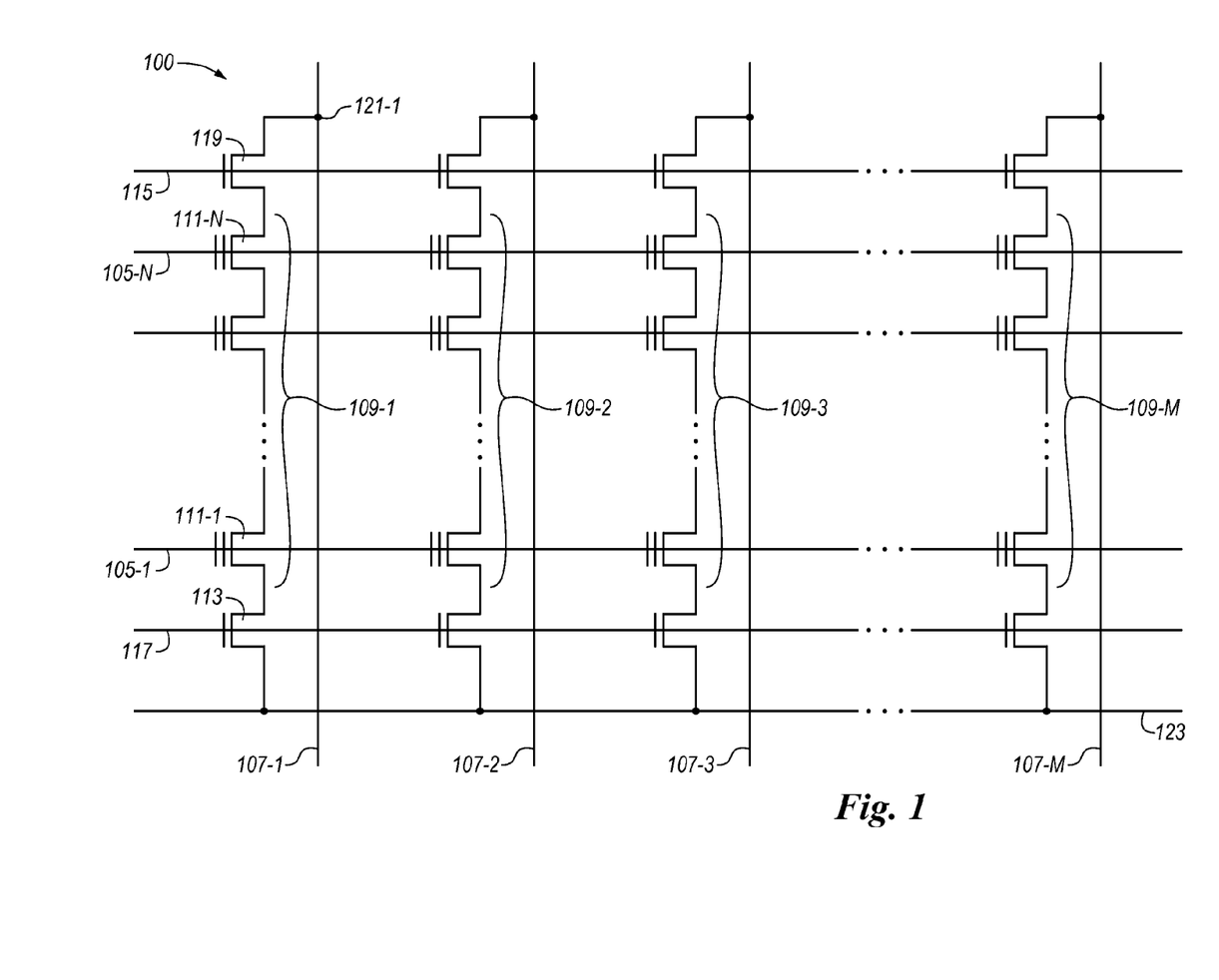
FIG. 1 is a schematic of a portion of a non-volatile memory array in accordance with one or more embodiments of the present disclosure.

FIG. 1 is a schematic of a portion of a non-volatile memory array 100 in accordance with one or more embodiments of the present disclosure. The embodiment of FIG. 1 illustrates a NAND architecture non-volatile memory array. However, embodiments described herein are not limited to this example. As shown in FIG. 1, the memory array 100 includes access lines, e.g., word lines 105-1, . . . , 105-N and intersecting data lines, e.g., local bit lines 107-1, 107-2, 107-3, . . . , 107-M. For ease of addressing in the digital environment, the number of word lines 105-1, . . . , 105-N and the number of local bit lines 107-1, 107-2, 107-3, . . . , 107-M can be some power of two, e.g., 256 word lines by 4,096 bit lines.

Memory array 100 includes NAND strings 1091, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a local bit line 107-1, 107-2, 107-3, . . . , 107-M. The non-volatile memory cells 111-1, . . . , 111-N of each NAND string 109-1, 109-2, 109-3, . . . , 109-M are connected in series source to drain between a source select gate (SOS), e.g., a field-effect transistor (FET) 113, and a drain select gate (SOD), e.g., FET 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N, e.g., a floating-gate transistor, of the corresponding NAND string 109-1.

In one or more embodiments, construction of the non-volatile memory cells 111-1, . . . , 111-N includes a source, a drain, a floating gate or other charge storage node, and a control gate. The non-volatile memory cells 111-1, . . . , 111-N have their control gates coupled to a word line, 105-1, . . . , 105-N respectively. A "column" of the non-volatile memory cells, 111-1, . . . , 111-N, make up the NAND strings 109-1, 109-2, 109-3, . . . , 109-M, and are coupled to a given local bit line 107-1, 107-2, 107-3, . . . , 107-M, respectively. A "row" of the non-volatile memory cells are those memory cells commonly coupled to a given word line 105-1, . . . , 105-N. The use of the terms "column" and "row" is not meant to imply a particular linear, e.g., vertical and/or horizontal, orientation of the non-volatile memory cells. A NOR array architecture would be similarly laid out, except that the string of memory cells would be coupled in parallel between the select gates.

As one of ordinary skill in the art will appreciate, subsets of cells coupled to a selected word line, e.g., 105-1, . . . , 105-N, can be programmed and/or sensed, e.g., read, together as a group. A programming operation, e.g., a write operation, can include applying a number of program pulses, e.g., 16V-20V, to a selected word line in order to increase the threshold voltage (Vt) of selected cells coupled to that selected access line to a desired program voltage level corresponding to a desired program state.

A sensing operation, such as a read or program verify operation, can include sensing a voltage and/or current change of a bit line coupled to a selected cell in order to determine the state of the selected cell. The sensing operation can involve providing a voltage to, e.g., biasing, a bit line, e.g., bit line 107-1, associated with a selected memory cell above a voltage, e.g., bias voltage, provided to a source line, e.g., source line 123, associated with the selected memory cell. A sensing operation could alternatively include pre-charging the bit line 107-1 followed with discharge when a selected cell begins to conduct, and sensing the discharge.

Sensing the state of a selected cell can include providing a number of sensing voltages, e.g., read voltages, to a selected word line while providing a number of voltages, e.g., read pass voltages, to the word lines coupled to the unselected cells of the string sufficient to place the unselected cells in a conducting state independent of the threshold voltage of the unselected cells. The bit line corresponding to the selected cell being read and/or verified can be sensed to determine whether or not the selected cell conducts in response to the particular sensing voltage applied to the selected word line. For example, the state of a selected cell can be determined by the word line voltage at which the bit line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the state of the selected cell can be determined based on the current and/or voltage sensed on the bit line corresponding to the string. For instance, the state of the selected cell can be determined based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string, the diffused regions between cell stacks, and the select transistors.

Memory array 100, e.g., a memory device that includes memory array 100, can have a lifetime associated therewith. During the lifetime of memory array 100, e.g., during the lifetime of the memory device that includes memory array 100, a number of programming, sensing, and erase cycles may be performed on memory array 100. The lifetime of the memory device may end, e.g., the memory device may fail, when programming, sensing, or erase operations performed on memory array 100 are no longer accurate or reliable. The lifetime of the memory device may depend on, for example, the storage and/or operating temperature of the memory device, and/or the error correction capability of the device, among other factors. Monitoring and/or anticipating the remaining lifetime of a memory device, e.g., the anticipated point at which the device may fail, will be further described herein.

Figure 2:
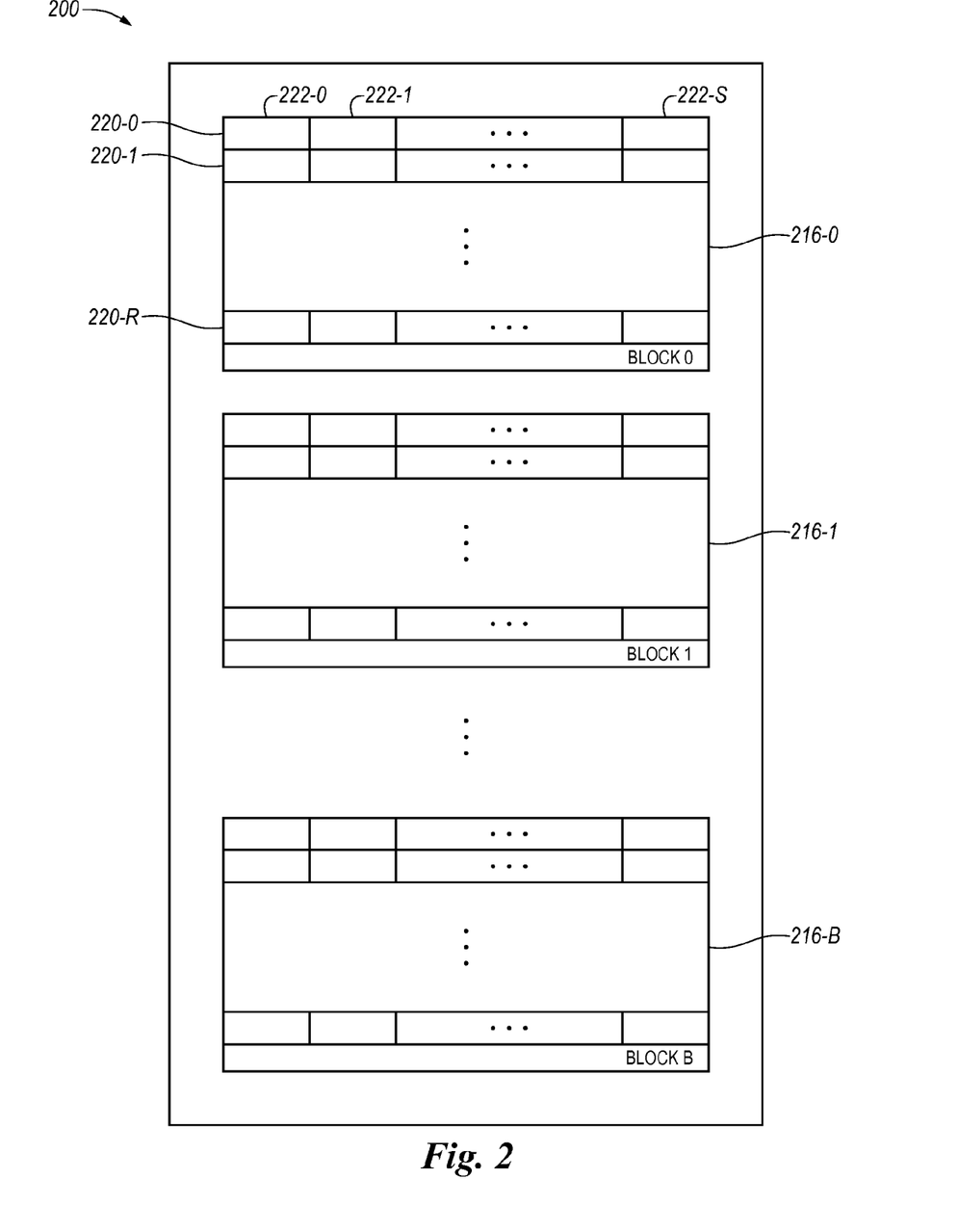
FIG. 2 illustrates a diagram of a portion of a memory array having a number of physical blocks in accordance with one or more embodiments of the present disclosure.

FIG. 2 illustrates a diagram of a portion of a memory array 200 having a number of physical blocks in accordance with one or more embodiments of the present disclosure. Memory array 200 can be, for example, a NAND non-volatile memory array, such as memory array 100 previously described in connection with FIG. 1. However, embodiments of the present disclosure are not limited to a particular type of memory array. For example, memory array 200 can have a non-volatile NOR flash memory array architecture. Further, although not shown in FIG. 2, one of ordinary skill in the art will appreciate that memory array 200 can be located on a particular semiconductor die along with various peripheral circuitry associated with the operation thereof.

As shown in FIG. 2, memory array 200 has a number of physical blocks 216-0 (BLOCK 0), 216-1 (BLOCK 1), ..., 216-B (BLOCK B) of memory cells. The memory cells can be single level cells and/or multilevel cells. As an example, the number of physical blocks in memory array 200 may be 128 blocks, 512 blocks, or 1,024 blocks, but embodiments are not limited to a particular multiple of 128 or to any particular number of physical blocks in memory array 200.

In the example shown in FIG. 2, each physical block 216-0, 216-1, ..., 216-B includes memory cells which can be erased together as a unit (e.g., the cells in each physical block can be erased in a substantially simultaneous manner). For instance, the memory cells in each physical block can be erased together in a single erase operation, as will be further described herein.

As shown in FIG. 2, each physical block 216-0, 216-1, ..., 216-B contains a number of physical rows, e.g., 220-0, 220-1, ..., 220-R, of memory cells coupled to access lines, e.g., word lines. The number of rows, e.g., word lines, in each physical block can be 32, but embodiments are not limited to a particular number of rows 220-0, 220-1, ..., 220-R per physical block.

As one of ordinary skill in the art will appreciate, each row 220-0, 220-1, ..., 220-R can include, e.g., store, one or more physical pages of data. A physical page refers to a unit of programming and/or sensing, e.g., a number of cells that are programmed and/or sensed together or as a functional group of memory cells. In the embodiment shown in FIG. 2, each row 220-0, 220-1, ..., 220-R stores one page of data. However, embodiments of the present disclosure are not so limited. For instance, in one or more embodiments of the present disclosure, each row can store multiple pages of data, with one or more even pages of data associated with even-numbered bit lines, and one or more odd pages of data associated with odd numbered bit lines. Additionally, for embodiments including multilevel cells, a physical page can be logically divided into an upper page and a lower page of data, with each cell in a row contributing one or more bits towards an upper page of data and one or more bits towards a lower page of data. In one or more embodiments, a memory array can include multiple physical blocks of memory cells and each physical block can be organized into multiple pages.

In one or more embodiments of the present disclosure, and as shown in FIG. 2, a page associated with a row can store data, e.g., after a programming operation, in accordance with a number of physical sectors 222-0, 222-1, ..., 222-S. Each physical sector 222-0, 222-1, ..., 222-S can store data corresponding to a logical sector, can store system and/or user data, and can include overhead information, such as error correction code (ECC) information and logical block address (LBA) information. As one of ordinary skill in the art will appreciate, logical block addressing is a scheme that can be used by a host for identifying a logical sector of information, e.g., each sector can correspond to a unique LBA. As an example, a logical sector of data can be a number of bytes of data, e.g., 256 bytes, 512 bytes, or 1,024 bytes. However, embodiments are not limited to these examples.

It is noted that other configurations for the physical blocks 216-0, 216-1, ..., 216-B, rows 220-0, 220-1, ..., 220-R, sectors 222-0, 222-1, ..., 222-S, and pages are possible. For example, rows 220-0, 220-1, ..., 220-R of physical blocks 216-0, 216-1, ..., 216-B can each store data corresponding to a single sector which can include, for example, more or less than 512 bytes of data.

As previously described herein, the memory cells in each physical block 216-0, 216-1, ..., 216-B can be erased together in a single erase operation. One example of such an erase operation can begin with a selection of the block of memory cells to be erased. The selected block can then be erased by setting the erase voltage parameters, e.g., "Verase magnitude", and issuing a quantity of erase pulses having the erase voltage parameters to the block of memory cells. Subsequently, a first erase verification can be performed to determine whether the quantity of erase pulses have satisfactorily erased the memory cells in the block. If the memory cells have not been satisfactorily erased, additional erase pulses can be issued, and periodic erase verification can be performed, until it is determined that satisfactory erasure of the memory cells to a particular first threshold has occurred. The erase voltage parameters of the erase pulses may be adjusted during this process, including but not limited to, adjusting the maximum erase voltage used.

After it is determined that satisfactory erasure of the memory cells to the particular first threshold has occurred, soft programming parameters, e.g., "Vsoft_pgm", can be set, and soft program pulses having the soft programming parameters can be issued to the block of memory cells. Subsequent to issuing the soft program pulses, a second type of erase process verification can be performed to determine whether the memory cells in the block have been satisfactorily soft programmed to particular performance criteria. If the memory cells have not been satisfactorily soft programmed, additional soft program pulses can be issued, and periodic verification can be performed, until it is determined that satisfactory soft programming of the memory cells to the particular performance criteria has occurred, thereby indicating successful erasure of the memory cells, e.g., completion of the erase operation.

The soft programming parameters of the soft program pulses may be adjusted before or during the soft programming process, including but not limited to, adjusting the soft programming voltage used. The adjustments made to the soft programming parameters may, for example, be based at least partially on the quantity of erase pulses and/or the maximum erase voltage used.

In one or more embodiments, the quantity of erase pulses associated with an erase operation performed on a block of memory cells, e.g., the erase pulse count associated with the erase operation, can be used to monitor and/or anticipate the remaining lifetime of a memory device that includes the block of memory cells. That is, the erase pulse count can be used to anticipate a point at which the memory device may fail.

Additionally, if the erase operation includes soft programming, e.g., if the memory cells are not satisfactorily erased after the quantity of erase pulses are issued, the quantity of soft program pulses associated with the erase operation performed on the block of memory cells, e.g., the soft program pulse count associated with the erase operation, can also be used to monitor and/or anticipate the remaining lifetime of the memory device. That is, the soft program pulse count can be used to anticipate a point at which the memory device may fail.

For example, if the erase pulse count and/or soft program pulse count advances relative to an erase pulse count lifetime marker and/or a soft program pulse count lifetime marker, respectively, associated with the memory cells in the block, it may indicate that the remaining lifetime of the memory device has decreased. An advancement of the erase pulse count relative to the erase pulse count lifetime marker can correspond to an increase in the erase pulse count, and/or an advancement of the soft program pulse count relative to the soft program pulse count lifetime marker can correspond to a decrease in the soft program pulse count. That is, an increase in the erase pulse count and/or a decrease in the soft program pulse count may indicate that the remaining lifetime of the memory device has decreased. Such advances will be further described in connection with FIGS. 5A-5C.

In one or more embodiments, the erase pulse count lifetime marker and/or the soft program pulse count lifetime marker can correspond to an anticipated failure point of the memory device. That is, as the erase pulse count and/or soft program pulse count advance toward the erase pulse count lifetime marker and/or the soft program pulse count lifetime marker, respectively, the anticipated failure point of the memory device may be approached. Further, if the erase pulse count and/or soft program pulse count advance past the erase pulse count lifetime marker and/or the soft program pulse count lifetime marker, respectively, it may indicate that the life of the memory device may end soon, e.g., the memory device may fail soon. The anticipated failure point of the memory device, e.g., the erase pulse count lifetime marker and/or the soft program pulse count lifetime marker, can be associated with, e.g., depend on, for example, the intended lifetime of the memory device and/or the error correction capability of the memory device. Further, the anticipated failure point of the memory device can correspond to, for example, a particular quantity of total data programmed to the memory device and/or the number of programming and/or erase operations, e.g., performed on the memory device.

For example, 10 erase pulses can be set as the erase pulse count lifetime marker associated with the memory cells in the block. As the erase pulse count associated with an erase operation performed on the block increases toward 10, it may indicate that the remaining lifetime of the memory device has decreased. If the erase pulse count advances past 10, it may indicate that a failure of the memory device may soon occur.

Conversely, if the erase pulse count and/or soft program pulse count retreat relative to the erase pulse count lifetime marker and/or the soft program pulse count lifetime marker, respectively, e.g., due to environmental conditions, it may indicate that the remaining lifetime of the memory device has increased. A retreat of the erase pulse count relative to the erase pulse count lifetime marker can correspond to a decrease in the erase pulse count, and/or a retreat of the soft program pulse count relative to the soft program pulse count lifetime marker can correspond to an increase in the soft program pulse count. That is, a decrease in the erase pulse count and/or an increase in the soft program pulse count may indicate that the remaining lifetime of the memory device has increased. Such retreats will be further described in connection with FIGS. 5A-5C. That is, as the erase pulse count and/or soft program pulse count retreats away from the erase pulse count lifetime marker and/or the soft program pulse count lifetime marker, respectively, the anticipated failure point of the memory device may be moved away from.

Figure 3:
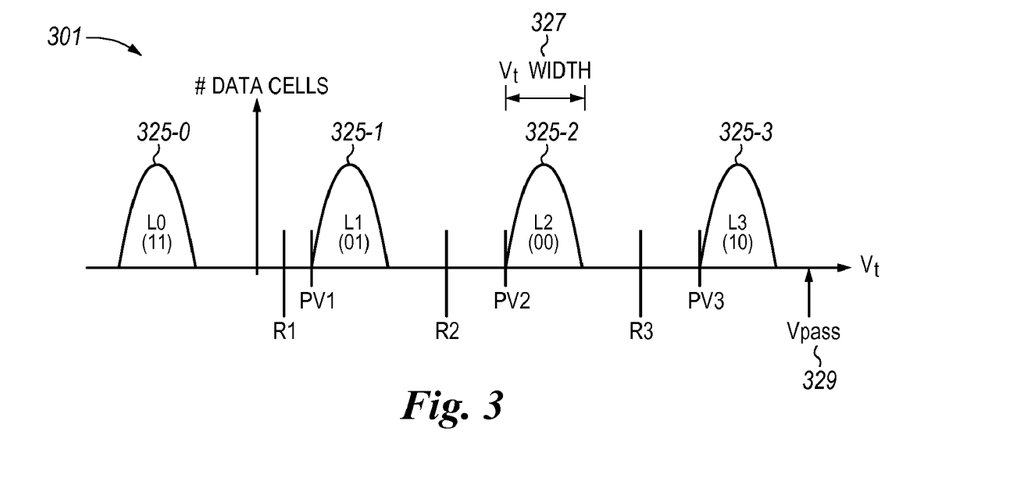
FIG. 3 illustrates a diagram of a number of threshold voltage distributions, sensing voltages, and program verify voltages in accordance with one or more embodiments of the present disclosure.

FIG. 3 illustrates a diagram 301 of a number of threshold voltage distributions, sensing voltages, and program verify voltages in accordance with one or more embodiments of the present disclosure. The example shown in FIG. 3 represents two-bit, e.g., four-state, memory cells. However, embodiments of the present disclosure are not limited to this example of two-bit memory cells, as will be appreciated by one of skill in the art.

As shown in FIG. 3, threshold voltage (Vt) distributions 325-0, 325-1, . . . , 325-2, and 325-3 represent four states, e.g., L0, L1, L2, and L3, respectively, to which the memory cells can be programmed. In the example illustrated in FIG. 3, Vt distribution 325-3 can be referred to as a maximum Vt, e.g., "$Vt_{max}$", to which a cell can be programmed because it is the range including the Vt with the largest magnitude. In operation, the memory cells in a selected block can be erased together such that they have a Vt level within Vt distribution 325-0 prior to being programmed. As such, distribution 325-0 can be referred to as an erased state and can represent a particular stored data state (L0), e.g., stored data such as binary "11". State L1 can correspond to data 01, state L2 can correspond to data 00, and state L3 can correspond to data 10.

Vt distributions 325-0, 325-1, 325-2, and 325-3 can represent a number of memory cells that are programmed to the corresponding states, where the height of a Vt distribution curve indicates a number of cells programmed to a particular voltage within the Vt distribution, on average. The width of the Vt distribution curve 327 indicates the range of voltages that represent a particular state, e.g., the width of the Vt distribution curve 325-2 for L2 represents the range of voltages that correspond to data 00.

A number of sensing voltages are illustrated in FIG. 3. Such sensing voltages can include program verify voltages and/or read voltages, among other sensing voltages. For example, program verify voltages PV1, PV2, and PV3 are illustrated, as well as read voltages R1, R2, and R3. A program verify operation can be performed after one or more programming pulses to help determine whether a memory cell has been programmed within a desired Vt range to help prevent the memory cell from receiving further programming pulses, e.g., "over programming" the cell. For instance, memory cells to be programmed to the L1 state can be program verified with a voltage PV1. Similarly, program verify voltage PV2 can be used with cells to be programmed to L2 and PV3 can be used with cells to be programmed to L3.

In the example illustrated in FIG. 3, voltage levels R1, R2, and R3 represent sensing voltages, e.g., read voltages, that can be used to distinguish between data states L0, L1, L2, and L3 during a sensing operation. In a sensing operation performed on a selected memory cell in a NAND string, the unselected memory cells of the string can be biased with a pass voltage "Vpass" 329 so as to be in a conducting state. As illustrated in FIG. 3, Vpass 329 can have a greater magnitude than $Vt_{max}$. When all cells in a string are in a conductive state, current can flow between the source line contact at one end of the string and a drain line contact at the other end of the string. As such, the state of the selected cell can be determined based on the current and/or voltage sensed on a bit line corresponding to a particular string when the selected cell begins to conduct. For example, the logical value of data stored in a selected cell can be determined based on whether the bit line current changes by a particular amount, or reaches a particular level within a given time period. Other types of sensing operations are also possible, as will be understood by one of ordinary skill in the art.

The quantity of sensing operations performed on a particular memory cell, can affect performance characteristics of the memory cell. As an example, a "read disturb" mechanism is a perturbation of a memory cell that can be caused by performing multiple sensing operations on the cell. As described herein, during a sensing operation, access gates of unselected memory cells can be biased with Vpass 329, which can be a higher voltage than $Vt_{max}$. Although Vpass 329 can be lower than a voltage associated with a programming pulse, repeatedly applying Vpass 329 to a particular memory cell, e.g., during multiple sensing operations, can perturb the Vt of the particular memory cell in a similar fashion to a programming pulse. That is, repeatedly applying Vpass 329 to the access gate of the particular memory cell can cause the Vt of the cell to shift, e.g., increase. In some instances, such a Vt shift can change the state of the particular memory cell. For example, if the particular memory cell were programmed to a Vt 325-1 associated with state L1, e.g., data 01, repeatedly applying Vpass to the particular cell could cause the Vt of the particular cell to shift, e.g., increase to the point where it was higher than R2, or even within the Vt 225-2 associated with state L2, e.g., data 00.

Accordingly, read disturb can result in erroneous data being sensed during a sensing operation. For example, a memory cell that has undergone read disturb may be sensed as being in a state that is not the state to which the cell was programmed. For instance, a memory cell programmed to state L1 that has undergone read disturb may be sensed as being in state L2, e.g., data programmed as 01 may be erroneously sensed as 00.

Read disturb can also result in erroneous data associated with multiple memory cells being sensed during a sensing operation. For example, a particular cell programmed to a Vt 325-3 associated with state L3, e.g., data 10, could be perturbed such that the Vt of the particular cell shifted, e.g., increased, above Vpass 329. In such an instance, Vpass 329 could then be insufficient to cause the particular cell to conduct, e.g., "turn on." Accordingly, a sensing operation performed on a string of memory cells, e.g., string 109-1 shown in FIG. 1, including the particular cell could result in erroneous data. That is, no cell on the string could be sensed, because the particular cell may not conduct when Vpass 329 is applied to it. In such an instance, current could not flow through the string to a bit line and/or sensing circuitry to allow for sensing one or more cells on the string.

In one or more embodiments, a read disturb value associated with one or more memory cells can be used to monitor and/or anticipate the remaining lifetime of a memory device that includes the memory cells. That is, the read disturb value can be used to anticipate a point at which the memory device may fail. The read disturb value can be, for example, a Vt shift, e.g., increase, undergone by the memory cells, and/or a quantity of erroneous data sensed during a sensing operation performed on the memory cells. The read disturb value can be determined in association with a sensing operation performed on the memory cells, e.g., a sensing operation that results in read disturb. The read disturb value can also be determined using a gate stress operation performed on the memory cells that can be analogous to a read disturb mechanism, as will be further described herein.

In one or more embodiments, if the read disturb value advances relative to a read disturb lifetime marker associated with the memory cells, it may indicate that the remaining lifetime of the memory device has decreased. An advancement of the read disturb value relative to the read disturb lifetime marker can correspond to an increase in the read disturb value. That is, an increase in the read disturb value may indicate that the remaining lifetime of the memory device has decreased. Such an advance will be described further in connection with FIGS. 5A-5C.

The read disturb lifetime marker can correspond to an anticipated failure point of the memory device. That is, as the read disturb value advances toward the read disturb lifetime marker, the memory device may be approaching an anticipated failure point. Further, if the read disturb value advances past the read disturb lifetime marker, it may indicate that the life of the memory device may end soon, e.g., the memory device may fail soon. The anticipated failure point of the memory device, e.g., the read disturb lifetime marker, can be associated with, e.g., depend on, for example, the intended lifetime of the memory device and/or the error correction capability of the memory device. Further, the anticipated failure point of the memory device can correspond to, for example, a particular quantity of total data programmed to the memory device and/or the number of programming and/or erase operations, e.g., performed on the memory device.

Conversely, if the read disturb value retreats relative to the read disturb lifetime marker, e.g., due to environmental conditions, it may indicate that the remaining lifetime of the memory device has increased. A retreat of the read disturb value relative to the read disturb lifetime marker can correspond to a decrease in the read disturb value. That is, a decrease in the read disturb value may indicate that the remaining lifetime of the memory device has increased. Such a retreat will be described further in connection with FIGS. 5A-5C. That is, as the read disturb value retreats away from the read disturb lifetime marker, the anticipated failure point of the memory device may be moved away from.

Figure 4:
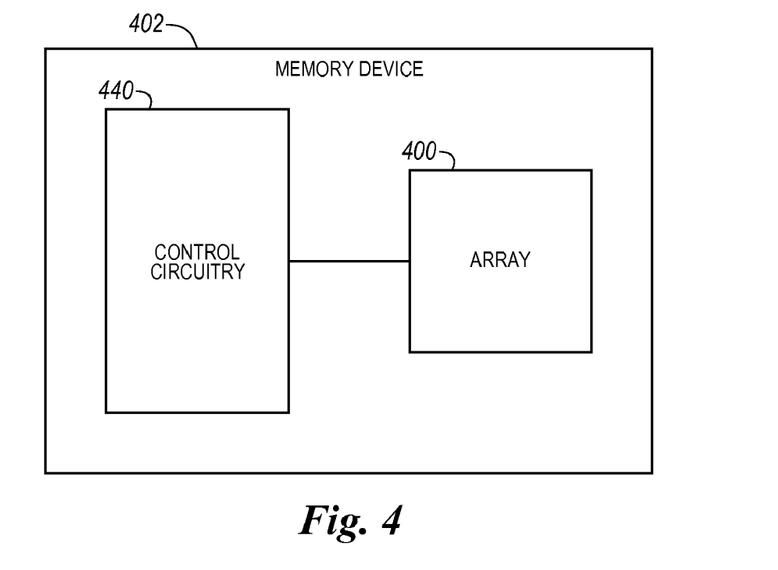
FIG. 4 illustrates a block diagram of a memory device in accordance with one or more embodiments of the present disclosure.

FIG. 4 illustrates a block diagram of a memory device 402 in accordance with one or more embodiments of the present disclosure. As shown in FIG. 4, memory device 402 includes memory array 400. Memory array 400 can be, for example, memory array 100 previously described in connection with FIG. 1 and/or memory array 200 previously described in connection with FIG. 2. Although one memory array is shown in FIG. 4, embodiments of the present disclosure are not so limited, e.g., memory device 402 can include more than one memory array.

As shown in FIG. 4, memory device 402 also includes control circuitry 440 coupled to memory array 400. Control circuitry 440 can be configured to monitor and/or anticipate the remaining lifetime of memory device 402 in accordance with one or more embodiments described herein.

For example, control circuitry 440 can be configured to determine a read disturb value associated with a number of memory cells, e.g., the memory cells in a particular number of blocks of memory cells, in memory array 400. The read disturb value can be, for example, a present read disturb value. Control circuitry 440 can be configured to provide an indicator, e.g., to a user of memory device 402, of an advance and/or retreat of the read disturb value relative to a read disturb lifetime marker, which may be predetermined, for example, associated with the number of memory cells. For example, control circuitry 440 can be configured to provide an indicator of an advance of the read disturb value past the read disturb lifetime marker, e.g., an indicator of an anticipated failure of memory device 402. The indicator can be, for example, a flag that is set, e.g., if the read disturb value advances past the read disturb lifetime marker. The read disturb lifetime marker can correspond to an anticipated failure point of memory device 402, as previously described herein.

An indicator of an advance of the read disturb value past the read disturb lifetime marker may indicate to a user of memory device 402 that a backup of the data stored by the memory cells in memory array 400 may be needed, e.g., because a failure of memory device 402 is anticipated. Additionally, control circuitry 440 can be configured to take a particular action in response to an indication of an advance of the read disturb value past the read disturb lifetime marker. For example, control circuitry 440 can be configured to trigger an operation to copy the data stored by the memory cells in memory array 400 if the read disturb value advances past the read disturb lifetime marker.

The particular number of blocks of memory cells can be, for example, less than the total number of blocks in memory array 440. That is, the particular number of blocks can be a representative subset of the total number of blocks in memory array 440. Using less than the total number of blocks can decrease the amount of time used by control circuitry 440 to monitor and/or anticipate the remaining lifetime of memory device 402. Alternatively, the particular number of blocks can be the total number of blocks in memory array 440. Using the total number of blocks can increase the accuracy and reliability of the anticipated remaining lifetime of memory device 402.

The read disturb value can be, for example, a threshold voltage (Vt) shift, e.g., increase, undergone by the memory cells, as previously described herein. Control circuitry 440 can be configured to perform a gate stress operation on the memory cells, and a sensing operation on the memory cells can subsequently be performed to determine a Vt shift, e.g., an average Vt shift, undergone by the memory cells. The gate stress operation can include, for example, applying a particular DC voltage, e.g., 8 Volts, to the memory cells for a particular time, e.g., 10 seconds, although embodiments of the present disclosure are not limited to a particular applied voltage or to a particular application time. Control circuitry 440 can also be configured to determine a Vt shift undergone by the memory cells in association with a sensing operation that results in read disturb, as previously described herein.

The read disturb value can also be, for example, a quantity of erroneous data sensed during a sensing operation performed on the memory cells, as previously described herein. Control circuitry 440 can be configured to perform a gate stress operation on the memory cells, subsequently perform a sensing operation on the memory cells, and determine a quantity of erroneous data, e.g., a quantity of erroneous bits, sensed during the sensing operation. Control circuitry 440 can also be configured to determine a quantity of erroneous data sensed during a sensing operation that results in read disturb.

Control circuitry 440 can be configured to determine the read disturb value and provide the indicator at a particular interval throughout the lifetime of memory device 402. The interval can be, for example, a time-based interval, or the interval can be based on a number of program/erase cycles performed on memory array 400.

Additionally or alternatively, control circuitry 440 can be configured to determine an erase pulse count associated with an erase operation performed on a number of memory cells, e.g., the memory cells in a particular number of blocks of memory cells, in memory array 400. The erase pulse count can be, for example, a present erase pulse count. That is, control circuitry 440 can be configured to count a quantity of erase pulses associated with, e.g., performed as part of the erase operation. If the erase operation includes soft programming, e.g., if the quantity of erase pulses do not satisfactorily erase the memory cells, control circuitry 440 can be configured to also determine a soft program pulse count, e.g., a present soft program pulse count, associated with the erase operation. The particular number of blocks of memory cells can be less than the total number of blocks in memory array 440, or the total number of blocks in memory array 440, as previously described herein.

Control circuitry 440 can be configured to provide an indicator, e.g., to a user of memory device 402, of an advance and/or retreat of the erase pulse count and/or the soft program pulse count relative to an erase pulse count lifetime marker and/or a soft program pulse count lifetime marker, respectively, which may be predetermined, for example, associated with the number of memory cells. For example, control circuitry 440 can be configured to provide an indicator of an advance of the erase pulse count and/or the soft program pulse count past the erase pulse count lifetime marker and/or the soft program pulse count lifetime marker, respectively, e.g., an indicator of an anticipated failure of memory device 402. The indicator can be, for example, a flag that is set, e.g., if the erase pulse count and/or the soft program pulse count advances past the erase pulse count lifetime marker and/or the soft program pulse count lifetime marker, respectively. The erase pulse count lifetime marker and/or the soft program pulse count lifetime marker can correspond to an anticipated failure point of memory device 402, as previously described herein.

An indicator of an advance of the erase pulse count and/or the soft program pulse count past the erase pulse count lifetime marker and/or the soft program pulse count lifetime marker, respectively, may indicate to a user of memory device 402 that a backup of the data stored by the memory cells in memory array 400 may be needed, e.g., because a failure of memory device 402 is anticipated. Additionally or alternatively, control circuitry 440 can be configured to take a particular action in response to an indication of an advance of the erase pulse count and/or the soft program pulse count past the erase pulse count lifetime marker and/or the soft program pulse count lifetime marker, respectively. For example, control circuitry 440 can be configured to trigger an operation to copy the data stored by the memory cells in memory array 400 if the erase pulse count and/or the soft program pulse count advance past the erase pulse count lifetime marker and/or soft program pulse count lifetime marker, respectively.

Control circuitry 440 can be configured to determine the erase pulse count and/or the soft program pulse count and provide the indicator at a particular interval throughout the lifetime of memory device 402. The interval can be, for example, a time-based interval, or the interval can be based on a number of program/erase cycles performed on memory array 400.

The embodiment illustrated in FIG. 4 can include additional circuitry that is not illustrated so as not to obscure embodiments of the present disclosure. For example, memory device 402 can include address circuitry to latch address signals provided over I/O connectors through I/O circuitry. Address signals can be received and decoded by a row decoder and a column decoder, to access memory array 400. It will be appreciated by those skilled in the art that the number of address input connectors can depend on the density and architecture of memory device 402 and/or memory array 400.

The reaming lifetime of a memory device, e.g., memory device 402, can be accurately and/or reliably monitored and/or anticipated using embodiments of the present disclosure, e.g., using a read disturb value, erase pulse count, or soft program pulse count as described herein. For example, embodiments of the present disclosure can account for variations in the storage and/or operating environment, e.g., temperature, of the memory device that can alter the remaining lifetime of the memory device. Further, embodiments of the present disclosure can be used to monitor and/or anticipate the remaining lifetime of a memory device having multilevel cells (MLCs).

In contrast, previous approaches for monitoring and anticipating the remaining lifetime of a memory device may include tracking the number and/or duration of programming, sensing, and/or erase operations performed on the cells in the device. Such approaches, however, may not provide an accurate or reliable indication of the actual remaining lifetime of the memory device, because they may not account for variations in the storage and/or operating environment of the memory device that can alter the remaining lifetime of the memory device.

Figure 5A:
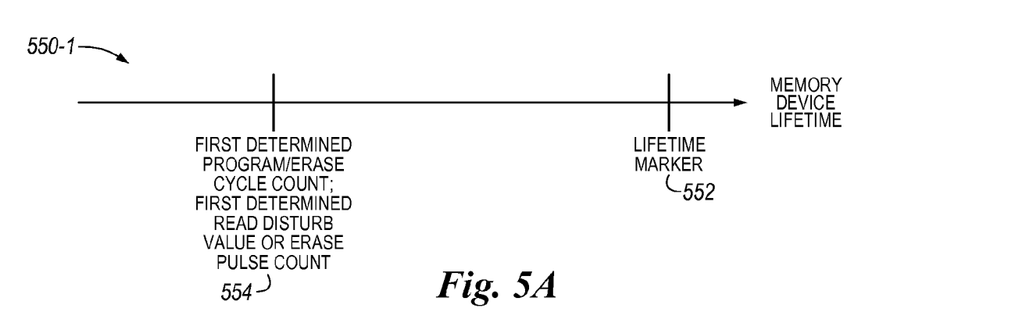
FIGS. 5A-5C illustrate a diagram having indicators of the anticipated remaining lifetime of a memory device at various points throughout the lifetime of the memory device in accordance with one or more embodiments of the present disclosure.
Figure 5B:
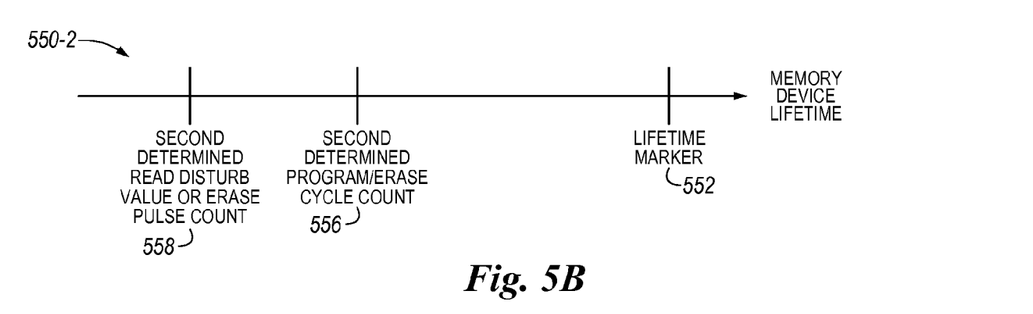
Figure 5C:
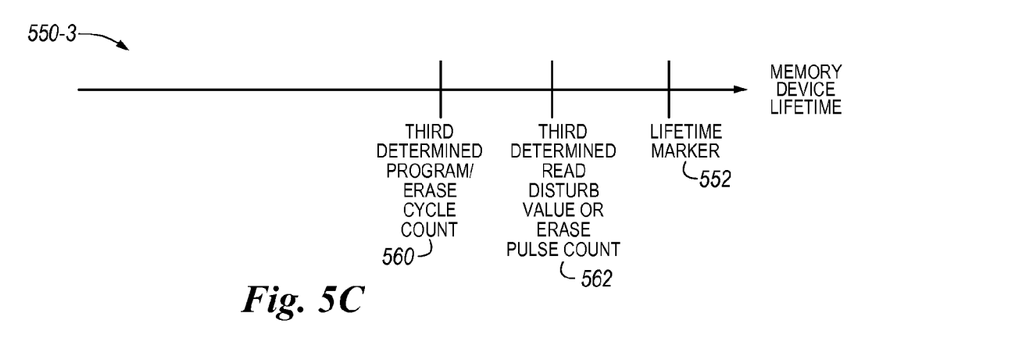

FIGS. 5A, 5B, and 5C illustrate diagrams 550-1, 550-2, and 550-3, respectively, having indicators of the anticipated remaining lifetime of a memory device, such as memory device 402 previously described in connection with FIG. 4, at various points throughout the lifetime of the memory device in accordance with one or more embodiments of the present disclosure. Diagram 550-1 shown in FIG. 5A illustrates an indicator 554 of the anticipated remaining lifetime of the memory device at a first point, e.g., time t1, during the lifetime of the memory device. Diagram 550-2 shown in FIG. 5B illustrates indicators 556 and 558 of the anticipated lifetime of the memory device at a second point, e.g., time t2 after time t1, during the lifetime of the memory device. Diagram 550-3 shown in FIG. 5C illustrates indicators 560 and 562 of the anticipated lifetime of the memory device at a third point, e.g., time t3 after time t2, during the lifetime of the memory device.

The indicators shown in FIGS. 5A-5C are shown relative to a lifetime marker 552, which may be predetermined, for example. Lifetime marker 552 can be, for example, a read disturb lifetime marker, an erase pulse count lifetime marker, and/or a soft program pulse count lifetime marker, as previously described herein. Lifetime marker 552 can correspond to an anticipated failure point of the memory device, as previously described herein. That is, if the indicators advance toward lifetime marker 552, it may indicate that the anticipated remaining lifetime of the memory has decreased, and a failure of the memory device may be anticipated if the indicators advance past lifetime marker 552. Conversely, if the indicators retreat away from lifetime marker 552, it may indicate that the anticipated remaining lifetime of the memory device has increased. The anticipated failure point can correspond to an anticipated failure point contained in the specifications for the memory device, such as, for example, a particular quantity of total data programmed to the memory device and/or the number of programming and/or erase operations, e.g., performed on the memory device.

In the embodiment illustrated in FIG. 5A, indicator 554 corresponds to a read disturb value or an erase pulse count determined to be associated with a number of memory cells of the memory device at time t1. The read disturb value and erase pulse count can be used to monitor and/or anticipate the remaining lifetime of the memory device in accordance with embodiments of the present disclosure, as previously described herein. Additionally, indicator 554 can correspond to a quantity of programming and erase operations determined to have been performed on the memory cells, e.g., a program/erase cycle count determined to be associated with the memory cells, at time t1. The program/erase cycle count can be used to monitor and/or anticipate the remaining lifetime of the memory device in accordance with previous approaches, as previously described herein.

As shown in FIG. 5A, the read disturb value, the erase pulse count and the program/erase cycle count each indicate the same anticipated remaining lifetime for the memory device at time t1, as indicated by indicator 554. For example, indicator 554 may indicate the memory device has an anticipated remaining lifetime equal to 60% of the anticipated total lifetime of the memory device.

In the embodiment illustrated in FIG. 5B, indicator 558 corresponds to a read disturb value or an erase pulse count determined to be associated with the memory cells at time t2. Indicator 556 corresponds to a program/erase cycle count determined to be associated with the memory cells at time t2.

As shown in FIG. 5B, read disturb value or erase pulse count indicator 558 indicates a different anticipated remaining lifetime for the memory device at time t2 than program/erase cycle count indicator 556. That is, read disturb value or erase pulse count indicator 558 indicates a greater anticipated remaining lifetime for the memory device at time t2 than program/erase cycle count indicator 556. Further, read disturb value or erase pulse count indicator 558 has retreated relative to lifetime marker 552, while program/erase cycle count indicator 556 has advanced relative to lifetime marker 552. That is, read disturb value or erase pulse count indicator 558 indicates a greater anticipated remaining lifetime for the memory device at time t2 than at time t1, while program/erase cycle count indicator 556 indicates a smaller anticipated remaining lifetime for the memory device at time t2 than at time t1. For example, indicator 558 may indicate the memory device has an anticipated remaining lifetime equal to 70% of the anticipated total lifetime of the memory device, and indicator 556 may indicate the memory device has an anticipated remaining lifetime equal to 50% of the anticipated total lifetime of the memory device.

The differences between read disturb value or erase pulse count indicator 558 and program/erase cycle count indicator 556 may occur because read disturb value or erase pulse count indicator 558 may account for variations in storage and/or operating environment, e.g., temperature, of the memory device that can alter the remaining lifetime of the memory device, while program/erase cycle count indicator 556 may not, as previously described herein. As such, the anticipated remaining lifetime indicated by read disturb value or erase pulse count indicator 558 may be more accurate and/or reliable than the anticipated remaining lifetime indicated by program/erase cycle count indicator 556, as previously described herein.

In the embodiment illustrated in FIG. 5C, indicator 562 corresponds to a read disturb value or an erase pulse count determined to be associated with the memory cells at time t3. Indicator 560 corresponds to a program/erase cycle count determined to be associated with the memory cells at time t3.

As shown in FIG. 5C, read disturb value or erase pulse count indicator 562 indicates a different anticipated remaining lifetime for the memory device at time t3 than program/erase cycle count indicator 560. That is, read disturb value or erase pulse count indicator 562 indicates a lower anticipated remaining lifetime for the memory device at time t3 than program/erase cycle count indicator 560. Further, read disturb value or erase pulse count indicator 562 has advanced a greater amount relative to lifetime marker 552 than program/erase cycle count indicator 560. For example, indicator 560 may indicate the memory device has an anticipated remaining lifetime equal to 40% of the anticipated total lifetime of the memory device, and indicator 562 may indicate the memory device has an anticipated remaining lifetime equal to 25% of the anticipated total lifetime of the memory device.

The differences between read disturb value or erase pulse count indicator 562 and program/erase cycle count indicator 560 may occur because read disturb value or erase pulse count indicator 562 may account for variations in storage and/or operating environment, e.g., temperature, of the memory device that can alter the remaining lifetime of the memory device, while program/erase cycle count indicator 560 may not, as previously described herein. As such, the anticipated remaining lifetime indicated by read disturb value or erase pulse count indicator 562 may be more accurate and/or reliable than the anticipated remaining lifetime indicated by program/erase cycle count indicator 560, as previously described herein.

CONCLUSION

The present disclosure includes lifetime markers for memory devices. One or more embodiments include determining a read disturb value, a quantity of erase pulses, and/or a quantity of soft program pulses associated with a number of memory cells, and providing an indicator of an advance and/or retreat of the read disturb value, the quantity of erase pulses, and/or the quantity of soft program pulses relative to a lifetime marker associated with the memory cells.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a memory device, comprising:
   determining a read disturb value associated with a number of memory cells;
   determining a quantity of erase pulses associated with the memory cells;
   determining a quantity of soft program pulses associated with the memory cells;
   providing an indicator of an advance and/or retreat of the read disturb value relative to a read disturb lifetime marker associated with the memory cells;
   providing an indicator of an advance and/or retreat of the quantity of erase pulses relative to an erase pulse lifetime marker associated with the memory cells; and
   providing an indicator of an advance and/or retreat of the quantity of soft program pulses relative to a soft program pulse lifetime marker associated with the memory cells.

2. The method of claim 1, wherein determining the quantity of erase pulses associated with the memory cells includes:
   determining a quantity of erase pulses associated with an erase operation performed on the memory cells.

3. The method of claim 1, wherein determining the quantity of soft program pulses associated with the memory cells includes:
   determining a quantity of soft program pulses associated with an erase operation performed on the memory cells.

4. The method of claim 1, wherein the read disturb lifetime marker, the erase pulse lifetime marker, and the soft program pulse lifetime marker are predetermined lifetime markers.

5. A method for operating a memory device, comprising:
   determining a read disturb value associated with a number of memory cells;
   determining a quantity of soft program pulses associated with the memory cells;
   providing an indicator of an advance and/or retreat of the read disturb value relative to a read disturb lifetime marker associated with the memory cells; and
   providing an indicator of an advance and/or retreat of the quantity of soft program pulses relative to a soft program pulse lifetime marker associated with the memory cells.

6. The method of claim 5, wherein determining the read disturb value associated with the memory cells includes:
   applying a voltage to the memory cells;
   performing a sensing operation on the memory cells after the voltage is applied to the memory cells; and
   determining a quantity of erroneous data sensed during the sensing operation.

7. The method of claim 5, wherein the method includes providing an indicator of an advance of the read disturb value past the read disturb lifetime marker.

8. The method of claim 5, wherein the method includes providing an indicator to a user of the memory device that a backup of data stored by the memory cells may be needed if the read disturb value advances past the read disturb lifetime marker.

9. The method of claim 5, wherein the method includes:
   determining a read disturb value associated with the memory cells at a particular interval; and
   providing an indicator of an advance and/or retreat of the read disturb value relative to a read disturb lifetime marker associated with the memory cells at the particular interval.

10. The method of claim 5, wherein the read disturb lifetime marker corresponds to an anticipated failure point of the memory device.

11. The method of claim 10, wherein the anticipated failure point of the memory device corresponds to a particular quantity of total data programmed to the memory device.

12. The method of claim 5, wherein the read disturb value is a present read disturb value.

13. A method for operating a memory device, comprising:
   determining a quantity of erase pulses associated with an erase operation performed on a number of memory cells;
   determining a read disturb value associated with the memory cells;
   providing an indicator of an advance and/or retreat of the quantity of erase pulses relative to an erase pulse lifetime marker associated with the memory cells; and providing an indicator of an advance and/or retreat of the read disturb value relative to a read disturb lifetime marker associated with the memory cells.

14. The method of claim 13, wherein the method includes:
determining a soft program pulse count associated with the erase operation performed on the memory cells; and
providing an indicator of an advance and/or retreat of the soft program pulse count relative to a soft program pulse count lifetime marker associated with the memory cells.

15. The method of claim 13, wherein determining the quantity of erase pulses associated with the erase operation includes determining an erase pulse count associated with the erase operation.

16. The method of claim 15, wherein the erase pulse count is a present erase pulse count.

17. The method of claim 13, wherein the erase pulse lifetime marker corresponds to an anticipated failure point of the memory device.

18. The method of claim 17, wherein the anticipated failure point of the memory device corresponds to a particular number of programming and erase operations performed on the memory device.

19. The method of claim 13, wherein the method includes:
determining a quantity of erase pulses associated with an erase operation performed on the memory cells at a particular interval; and
providing an indicator of an advance and/or retreat of the quantity of erase pulses relative to an erase pulse lifetime marker associated with the memory cells at the particular interval.

20. A memory device, comprising:
an array of memory cells; and
control circuitry coupled to the array, wherein the control circuitry is configured to:
determine a read disturb value associated with a number of the memory cells;
determine a quantity of erase pulses associated with the number of memory cells;
determine a quantity of soft program pulses associated with the number of memory cells;
provide an indicator of an advance and/or retreat of the read disturb value relative to a read disturb lifetime marker associated with the number of memory cells;
provide an indicator of an advance and/or retreat of the quantity of erase pulses relative to an erase pulse lifetime marker associated with the number of memory cells; and
provide an indicator of an advance and/or retreat of the quantity of soft program pulses relative to a soft program pulse lifetime marker associated with the number of memory cells.

21. The memory device of claim 20, wherein the control circuitry is configured to:
apply a voltage to the number of memory cells;
determine a threshold voltage shift associated with the number of memory cells, wherein the threshold voltage shift is determined by a sensing operation performed on the number of memory cells after the voltage is applied to the number of memory cells; and
determine the read disturb value associated with the number of memory cells based on the determined threshold voltage shift.

22. The memory device of claim 21, wherein the voltage is a voltage associated with a gate stress operation performed on the number of memory cells.

23. The memory device of claim 20, wherein the control circuitry is configured to provide an indicator of an advance of the read disturb value past the read disturb lifetime marker to a user of the memory device.

24. The memory device of claim 20, wherein the control circuitry is configured to trigger an operation to copy data stored by the memory cells in the array if the read disturb value advances past the read disturb lifetime marker.

25. The memory device of claim 20, wherein the read disturb lifetime marker is associated with an error correction capability of the memory device.

26. A memory device, comprising:
an array of memory cells; and
control circuitry coupled to the array, wherein the control circuitry is configured to:
determine a quantity of erase pulses associated with an erase operation performed on a number of the memory cells;
determine a read disturb value associated with the number of memory cells;
provide an indicator of an advance and/or retreat of the quantity of erase pulses relative to an erase pulse lifetime marker associated with the number of memory cells; and
provide an indicator of an advance and/or retreat of the read disturb value relative to a read disturb lifetime marker associated with the memory cells.

27. The memory device of claim 26, wherein the control circuitry is configured to:
determine a soft program pulse count associated with the erase operation performed on the number of memory cells; and
provide an indicator of an advance and/or retreat of the soft program pulse count relative to a soft program pulse count lifetime marker associated with the number of memory cells.

28. The memory device of claim 27, wherein the control circuitry is configured to provide an indicator of an advance of the soft program pulse count past the soft program pulse count lifetime marker.

29. The memory device of claim 27, wherein the control circuitry is configured to trigger an operation to copy data stored by the memory cells in the array if the soft program pulse count advances past the soft program pulse count lifetime marker.

30. The memory device of claim 26, wherein the erase pulse lifetime marker is associated with an anticipated remaining lifetime of the memory device.

31. The memory device of claim 26, wherein the memory cells are multilevel memory cells.

32. A memory device, comprising:
an array of memory cells, wherein the array includes one or more blocks of memory cells; and
control circuitry coupled to the array, wherein the control circuitry is configured to:
determine a read disturb value associated with the memory cells in a particular number of the blocks;
determine an erase pulse count associated with an erase operation performed on the memory cells in the particular number of blocks;
provide an indicator of an advance and/or retreat of the read disturb value relative to a read disturb lifetime marker associated with the memory cells in the particular number of blocks; and provide an indicator of an advance and/or retreat of the erase pulse count relative to an erase pulse count lifetime marker associated with the memory cells in the particular number of blocks.

33. The memory device of claim 32, wherein the particular number of blocks is less than a total number of blocks in the array.

34. The memory device of claim 32, wherein the particular number of blocks is a total number of blocks in the array.

35. The memory device of claim 32, wherein the read disturb value is a threshold voltage shift associated with the memory cells.

36. The memory device of claim 32, wherein the read disturb value is a quantity of erroneous data associated with the memory cells.

* * * * *